United States Patent
Fujimoto et al.

(10) Patent No.: US 10,315,344 B2
(45) Date of Patent: Jun. 11, 2019

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventors: Masayoshi Fujimoto, Utsunomiya (JP); Takuro Yamazaki, Utsunomiya (JP); Tomomi Funayoshi, Utsunomiya (JP); Hiromitsu Yamaguchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 491 days.

(21) Appl. No.: 14/978,559

(22) Filed: Dec. 22, 2015

(65) Prior Publication Data

US 2016/0193758 A1    Jul. 7, 2016

(30) Foreign Application Priority Data

Jan. 5, 2015  (JP) ................................. 2015-000513

(51) Int. Cl.
*G01B 11/00* (2006.01)
*B29C 43/58* (2006.01)
(Continued)

(52) U.S. Cl.
CPC ............ *B29C 43/58* (2013.01); *G03F 7/0002* (2013.01); *B29C 33/424* (2013.01); *B29C 43/021* (2013.01); *B29C 2035/0827* (2013.01); *B29C 2043/5833* (2013.01); *B29C 2043/5891* (2013.01); *B29K 2105/246* (2013.01); *B29L 2031/34* (2013.01)

(58) Field of Classification Search
CPC ..................................................... B29C 43/58
See application file for complete search history.

(56) References Cited

U.S. PATENT DOCUMENTS

2004/0189996 A1* 9/2004 Sreenivasan ........ B29C 35/0888
                                                              356/401
2007/0258079 A1* 11/2007 Kamidi ............... G03F 7/70725
                                                              355/72
2012/0286443 A1   11/2012 Sato

FOREIGN PATENT DOCUMENTS

CN      1476551 A       2/2004
JP      2005062035 A    3/2005
(Continued)

OTHER PUBLICATIONS

Office Action issued in Japanese Appln. No. 2015-000513 dated Oct. 19, 2018.
(Continued)

*Primary Examiner* — Galen H Hauth
(74) *Attorney, Agent, or Firm* — Rossi, Kimms & McDowell LLP

(57) ABSTRACT

The present invention provides an imprint apparatus which forms a pattern in an imprint material on a substrate by using a mold, the apparatus including a tilt unit configured to tilt the mold and the substrate relatively, a detection unit configured to detect an interference pattern between light reflected by the mold and light reflected by the substrate, and a control unit configured to control, based on the interference pattern detected by the detection unit in a state in which the mold and the imprint material on the substrate are in contact with each other, the tilt unit to reduce relative tilts between the mold and the substrate in the state.

9 Claims, 6 Drawing Sheets

(51) Int. Cl.
*G03F 7/00* (2006.01)
*B29C 43/02* (2006.01)
*B29C 33/42* (2006.01)
*B29L 31/34* (2006.01)
*B29K 105/24* (2006.01)
*B29C 35/08* (2006.01)

(56) References Cited

FOREIGN PATENT DOCUMENTS

| | | | |
|---|---|---|---|
| JP | 2005101313 | A | 4/2005 |
| JP | 2007299994 | A | 11/2007 |
| JP | 2009286067 | A | 12/2009 |
| JP | 2011029641 | A | 2/2011 |
| JP | 2011035408 | A | 2/2011 |
| JP | 2011243664 | A | 12/2011 |
| JP | 2012253325 | A | 12/2012 |
| JP | 2013070023 | A | 4/2013 |
| JP | 5645805 | B2 | 12/2014 |

OTHER PUBLICATIONS

Office Action issued in Korean Appln. No. 10-2015-0184585 dated Feb. 8, 2019.
Office Action issued in Chinese Appln. No. 201610007113.3 dated Mar. 25, 2019. English translation provided.

\* cited by examiner

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint technique is a technique of forming a pattern to an imprint material on a substrate by using a mold. The imprint technique has received attention as one of lithography techniques of manufacturing magnetic storage media and semiconductor devices. An imprint apparatus using the imprint technique cures the imprint material (for example, an uncured photo-curable resin) on the substrate in a state in which the mold and the imprint material are in contact with each other. Then, the imprint apparatus widens the interval between the substrate and the mold, and releases the mold from the cured imprint material on the substrate, thereby forming the pattern of the imprint material on the substrate.

In the imprint apparatus, there is known a technique of deforming (curving) the pattern surface of the mold into a convex shape with respect to the substrate and bringing the mold into contact with the imprint material on the substrate in order to promote filling of the concave portion of the pattern of the mold with the imprint material. The concave portion of the pattern is easily filled with the imprint material by bringing the mold and the imprint material into contact with each other from the center to the outer periphery of the pattern surface of the mold. This makes it possible to reduce bubble residues.

It is important in the imprint apparatus to keep the thickness (residual layer thickness) of the imprint material constant when curing the imprint material so as to prevent the pattern formed on the substrate from being influenced by an etching process in a post-process. It is therefore necessary to bring the mold and the imprint material into contact with each other in a state in which the pattern surface of the mold and the substrate are maintained in parallel. Japanese Patent Laid-Open No. 2007-299994 has proposed a technique related to this. Japanese Patent Laid-Open No. 2007-299994 has disclosed a technique of obtaining three-dimensional flatness of the mold and the substrate and controlling, based on this flatness, the orientation of the substrate when bringing the mold and the imprint material into contact with each other.

In the conventional technique, however, no consideration is given to deformation in the mold and the substrate which is caused by a force (pressing force) generated when bringing the mold and the imprint material on the substrate into contact with each other. Therefore, only with control of the orientation of the substrate based on three-dimensional flatness of the mold and the substrate, a deviation may occur in parallelism between the mold and the substrate when actually bringing the mold and the imprint material on the substrate into contact with each other.

SUMMARY OF THE INVENTION

The present invention provides an imprint apparatus advantageous in reducing the relative tilts between a mold and a substrate in a state in which the mold and an imprint material are in contact with each other.

According to one aspect of the present invention, there is provided an imprint apparatus which forms a pattern in an imprint material on a substrate by using a mold, the apparatus including a tilt unit configured to tilt the mold and the substrate relatively, a detection unit configured to detect an interference pattern between light reflected by the mold and light reflected by the substrate, and a control unit configured to control, based on the interference pattern detected by the detection unit in a state in which the mold and the imprint material on the substrate are in contact with each other, the tilt unit to reduce relative tilts between the mold and the substrate in the state.

Further aspects of the present invention will become apparent from the following description of exemplary embodiments with reference to the attached drawings.

DESCRIPTION OF THE EMBODIMENTS

Figure 1:
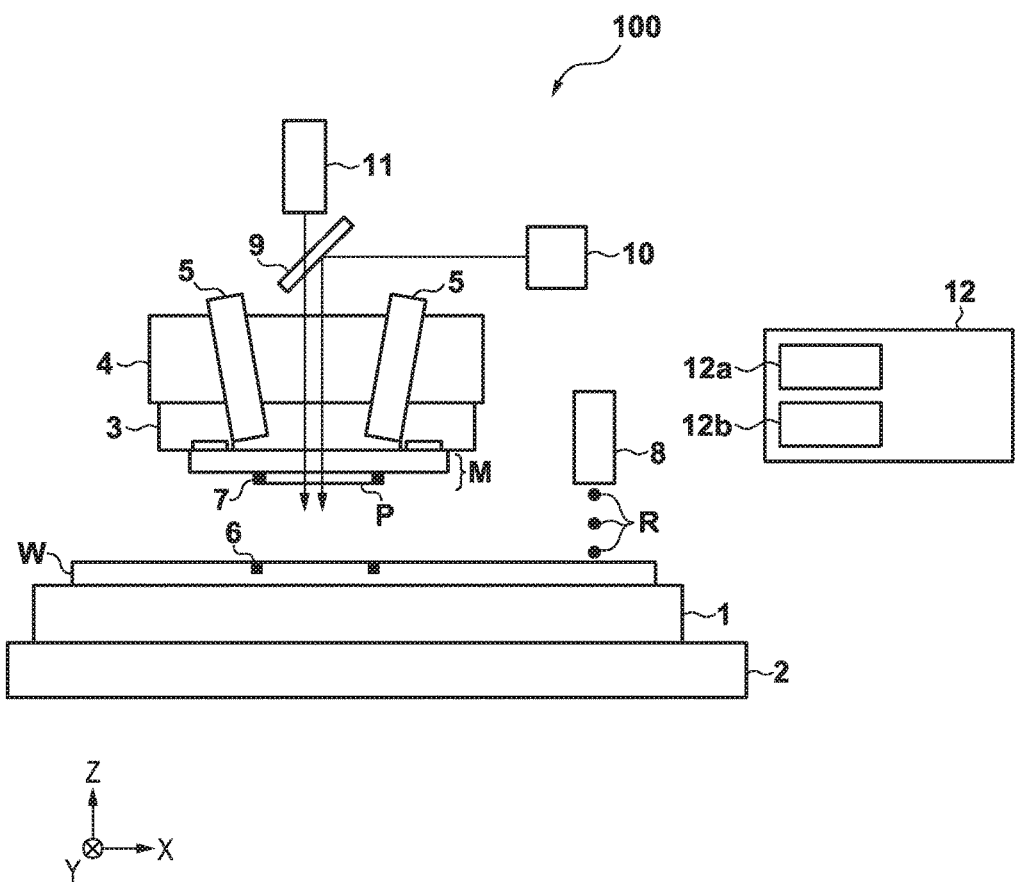
FIG. 1 is a schematic view showing the arrangement of an imprint apparatus according to the first embodiment of the present invention.

Preferred embodiments of the present invention will be described below with reference to the accompanying drawings. Note that the same reference numerals denote the same members throughout the drawings, and a repetitive description thereof will not be given.

First Embodiment

FIG. 1 is a schematic view showing the arrangement of an imprint apparatus 100 according to the first embodiment of the present invention. The imprint apparatus 100 is a lithography apparatus which forms a pattern in an imprint material on a substrate by using a mold. The imprint apparatus 100 performs an imprint process of forming the pattern on the substrate by curing the imprint material in a state in which the mold and the imprint material on the substrate are in contact with each other and releasing the mold from the cured imprint material. In this embodiment, a case in which an ultraviolet-curing resin which is cured by irradiation with ultraviolet rays is used as the imprint material will be described. The imprint material is not limited to the ultraviolet-curing resin, but may be a thermoplastic resin or a thermosetting resin.

The imprint apparatus 100 includes a substrate chuck 1 which holds a substrate W, a substrate stage 2 which moves while supporting the substrate chuck 1, a mold chuck 3 which holds a mold M on which a pattern P has been formed, and a mold stage 4 which moves while supporting the mold chuck 3. The imprint apparatus 100 also includes alignment scopes 5, a dispenser 8, a mirror 9, a light source 10 which emits ultraviolet rays, a detection unit 11, and a control unit 12. In this embodiment, the substrate stage 2 and the mold stage 4 function as tilt units which tilt the mold M and the substrate W relatively.

Each alignment scope 5 is fixed to the mold stage 4, and detects an alignment mark (substrate-side mark) 6 formed on the substrate W and an alignment mark (mold-side mark) 7 formed on the mold M. As a method of detecting the substrate-side mark 6 and the mold-side mark 7, for example, a method of detecting moire fringes (interference fringes) which reflect the relative positions of the two marks can be used. The relative positions of the two marks may be obtained by detecting the respective images of the substrate-side mark 6 and the mold-side mark 7.

The dispenser 8 functions as a resin supply unit which supplies a resin R onto the substrate. Note that the imprint apparatus 100 may not include the dispenser 8 when the substrate W onto which the resin R has been supplied by an external apparatus different from the imprint apparatus 100 is loaded to the imprint apparatus 100.

The mirror 9 includes a dichroic mirror, and has characteristics of reflecting the ultraviolet rays from the light source 10 and transmitting light (detection light) from the detection unit 11. The ultraviolet rays from the light source 10 are reflected by the mirror 9 and irradiate the resin R on the substrate via the mold M, thereby curing the resin R. The characteristics of the mirror 9 may be opposite. That is, the mirror 9 may have characteristics of transmitting the ultraviolet rays from the light source 10, and reflecting light from the detection unit 11 and light from the substrate W to the detection unit 11. In this case, the light source 10 and the detection unit 11 change arrangements in the imprint apparatus 100 shown in FIG. 1.

The detection unit 11 detects (observes) the pattern P of the mold M and a shot region on the substrate W by using light (for example, visible rays) having wavelengths different from those of the ultraviolet rays. More specifically, the detection unit 11 detects an interference pattern between light reflected by the mold M and light reflected by the substrate W. Light from the detection unit 11 passes through the mirror 9, the mold stage 4, and the mold chuck 3 and illuminates the shot region on the substrate W. Light which illuminates the shot region on the substrate W is reflected by the pattern surface of the mold M and the surface of the substrate W and detected, by the detection unit 11, as the interference pattern formed by interference light between reflected light from the mold M and reflected light from the substrate W. It is possible to observe a contact state between the mold M and the resin R on the substrate by the interference pattern detected by the detection unit 11.

Figure 2:
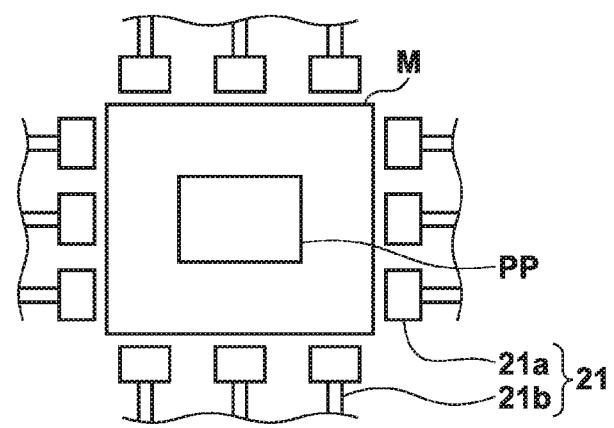
FIG. 2 is a view showing an example of the arrangement of shape correction units of the imprint apparatus shown in FIG. 1.

The control unit 12 includes a CPU 12a and a memory 12b. The control unit 12 performs the imprint process by controlling the entire imprint apparatus 100, that is, the respective units of the imprint apparatus 100. For example, the control unit 12 obtains the relative positions (displacement) of the mold M and the substrate W based on a detection result of the substrate-side mark 6 and the mold-side mark 7 by each alignment scope 5. Then, the control unit 12 moves, based on the relative positions of the mold M and the substrate W, the substrate stage 2 and the mold stage 4 so as to correct the displacement between the mold M and the substrate W. The displacement between the mold M and the substrate W includes a shift component, a magnification component, a rotation component, and the like. The control unit 12 can also correct the shape of the pattern P (pattern surface) on the mold M in accordance with the shape of the shot region on the substrate W by using shape correction units 21 arranged around the mold M, as shown in FIG. 2. Furthermore, in this embodiment, the control unit 12 controls, based on the interference pattern detected by the detection unit 11, the substrate stage 2 and the mold stage 4 which function as the tilt units so as to reduce the relative tilts between the mold M and the substrate W.

In this embodiment, each shape correction unit 21 corrects the shape of a pattern surface PP by applying a force in a direction parallel to the pattern surface PP to deform the mold M (pattern surface PP). For example, each shape correction unit 21 includes a contact portion 21a which contacts the side surface of the mold M, and an actuator 21b which drives the contact portion 21a in a direction to come close to the side surface of the mold M and a direction to move away from the side surface of the mold M, as shown in FIG. 2. Each contact portion 21a may include a suction mechanism for sucking the side surface of the mold M. Furthermore, each shape correction unit 21 may include a heating mechanism for applying heat to the mold M and the substrate W, and may deform the pattern surface PP by controlling the temperature of the mold M or may deform the shot region by controlling the temperature of the substrate W.

Figure 3:
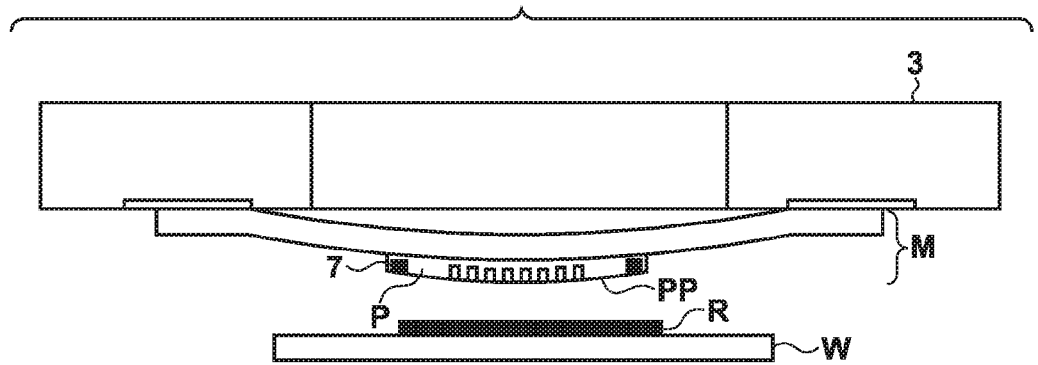
FIG. 3 is a view showing a state in which a pattern surface of a mold is deformed into a convex shape with respect to a substrate.

FIG. 3 is a view showing a state in which the pattern surface PP of the mold M is deformed (curved) into a convex shape with respect to the substrate W. A method of deforming the pattern surface PP of the mold M includes a method of applying a pressure to the mold M from the mold chuck 3 which holds the mold M. A closed space is formed between the mold M and the mold chuck 3. A pressure regulator which regulates the pressure (atmospheric pressure) in that space is arranged.

In this embodiment, the resin R on the substrate and the mold M, or more specifically a part of the pattern surface PP of the mold M are brought into contact with each other in the state in which the pattern surface PP of the mold M is deformed into the convex shape, as shown in FIG. 3. Then, after bringing the part of the pattern surface PP of the mold M into contact with the resin R, the contact area between the pattern surface PP and the resin R is increased by gradually returning the pattern surface PP to a flat surface (that is, canceling a curve), and the resin R is brought into contact with the entire surface of the pattern surface PP. It is possible to extrude a gas between the mold M and the resin R around the mold M by bringing the mold M and the resin R into contact with each other in the state in which the pattern surface PP of the mold M is deformed into the convex shape. It is therefore possible to suppress a bubble residue in the concave portion of the pattern P of the mold M and reduce defects in the pattern formed on the substrate.

Figure 4:
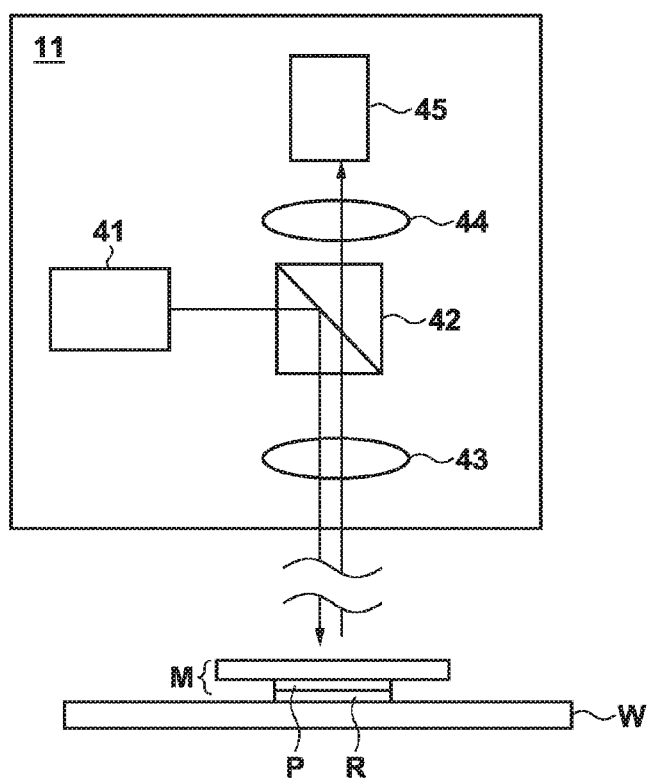
FIG. 4 is a view showing an example of the arrangement of a detection unit of the imprint apparatus shown in FIG. 1.

FIG. 4 is a view showing an example of the arrangement of the detection unit 11. The mold chuck 3, the mold stage 4, and the mirror 9 are not shown in FIG. 4. The detection unit 11 is formed by a scope which detects the entire or a partial surface of the shot region to which the pattern P of the mold M is transferred. The detection unit 11 includes a light source 41, a beam splitter 42, a lens 43, a lens 44, and an image sensor 45.

The light source 41 emits visible rays for illuminating the mold M and the substrate W. Light from the light source 41 is reflected by the beam splitter 42 and illuminates the substrate W via the lens 43. The image sensor 45 detects light reflected by the substrate W via the lens 43, the beam splitter 42, and the lens 44.

The image sensor 45 (the imaging plane thereof) is arranged on an optically conjugate surface to the surface of the substrate W and the pattern surface PP of the mold M in contact with the resin R on the substrate. The lenses 43 and 44 are arranged such that the images of the pattern surface PP of the mold M and the surface of the substrate W are formed in the image sensor 45 (the imaging plane thereof).

In this embodiment, light from the light source 41 is used as the visible rays. However, the present invention is not limited to this. The detection unit 11 detects the interference pattern in order to observe a contact state between the mold M (the pattern surface PP thereof) and the resin R on the substrate. Light (monochromatic light) having a narrow wavelength range is preferably used from the viewpoint of detecting the interference pattern. However, if light from the light source 41 is fixed to light having the narrow wavelength range, the interference pattern may not be detected depending on interference conditions on the mold M and the substrate W. It is therefore preferable that a wavelength can be changed. Light having a wide wavelength range (broadband light) may be used as long as an interference pattern detectable by the image sensor 45 is formed.

More specifically, it is possible to determine the wavelength of light emitted from the light source 41 by forming the light source 41 with a plurality of LEDs which emit light having different wavelengths, and selecting the optimal LED in accordance with the interference conditions on the mold M and the substrate W. Alternatively, the wavelength of light emitted from the light source 41 may be determined by forming the light source 41 with a ramp which emits light having the wide wavelength range and a plurality of wavelength filters which extract light beams having the different wavelengths, and switching to the optimal wavelength filter in accordance with the interference conditions on the mold M and the substrate W.

Figure 5A:
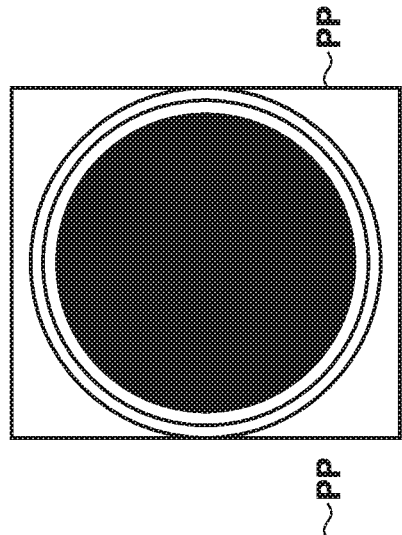
FIGS. 5A to 5F are views for explaining a change in an interference pattern in a pressing step.
Figure 5C:
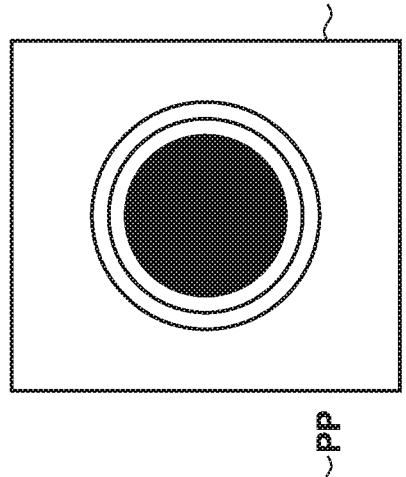
Figure 5E:
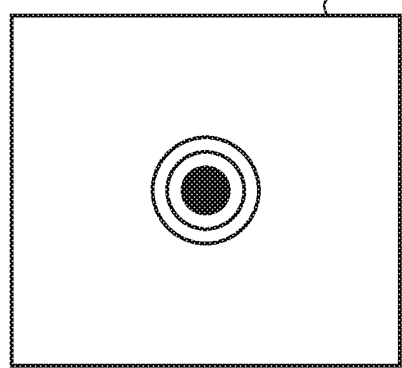
Figure 5B:
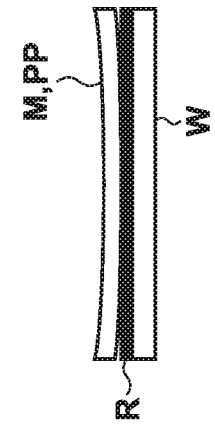

A change in the interference pattern in a pressing step of bringing the mold M and the resin R on the substrate into contact with each other in the state in which the pattern surface PP of the mold M is deformed into the convex shape will be described with reference to FIGS. 5A to 5F. Each of FIGS. 5A, 5C, and 5E shows the interference pattern detected by the detection unit 11 (that is, the image captured by the image sensor 45). Each of FIGS. 5B, 5D, and 5F shows the sections of the mold M (pattern surface PP) and the substrate W.

FIG. 5A shows the interference pattern detected by the detection unit 11 early in the pressing step. Early in the pressing step, a part (vertex) of the pattern surface PP of the mold M deformed into the convex shape contacts the resin R on the substrate. At this time, a region (a region whose center is filled) where the pattern surface PP of the mold M and the resin R are in contact with each other, and its surrounding interference fringes by an interference of light appear in the interference pattern detected by the detection unit 11. FIG. 5B shows the section of the mold M and the substrate W when the interference pattern as shown in FIG. 5A is detected.

Figure 5D:
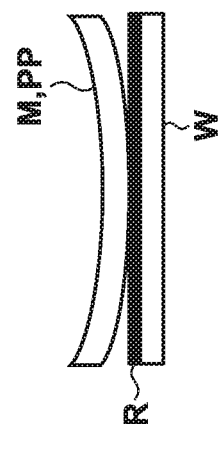

When the pattern surface PP starts to be returned to the flat surface after bringing the part of the pattern surface PP of the mold M into contact with the resin R, the contact area between the pattern surface PP and the resin R is increased, as shown in FIG. 5D. FIG. 5C shows the interference pattern detected by the detection unit 11 when the mold M and the substrate W are in a state shown in FIG. 5D. Referring to FIG. 5C, it can be found that the contact area between the pattern surface PP of the mold M and the resin R on the substrate is increased uniformly (concentrically) from the center to the peripheral portion of the pattern surface PP.

Figure 5F:
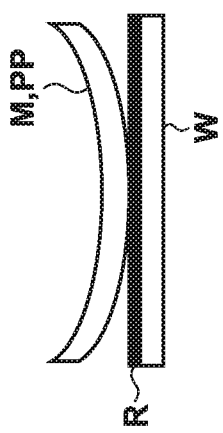

Furthermore, if the pattern surface PP of the mold M is returned to the flat surface gradually, the contact area between the pattern surface PP and the resin R is further increased, as shown in FIG. 5F. FIG. 5E shows the interference pattern detected by the detection unit 11 when the mold M and the substrate W are in a state shown in FIG. 5F.

Referring to FIGS. 5C and 5E, the interference fringes which appear around the region where the pattern surface PP and the resin R are in contact with each other also expand in accordance with an increase in the contact area between the pattern surface PP of the mold M and the resin R on the substrate. The interference fringes are generated by the interference between light reflected by the pattern surface PP of the mold M and light reflected by the surface of the substrate W. Finally, therefore, the entire surface of the pattern surface PP of the mold M contacts the resin R on the substrate, generating no interference fringe. This is because once the entire surface of the pattern surface PP of the mold M and the resin R on the substrate are in contact with each other, there will be little difference in the refractive indices between the pattern surface PP and the resin R, and there will be no light reflection on the surface of the pattern surface PP.

Figure 6:
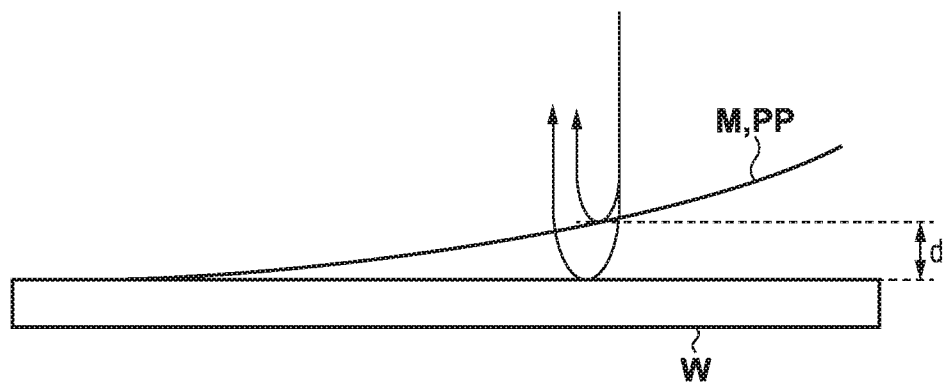
FIG. 6 is a view for explaining a phenomenon in which interference fringes are generated.

A phenomenon in which the interference fringes by the interference of light are generated around a contact region between the pattern surface PP of the mold M and the resin R on the substrate will be described with reference to FIG. 6. If the mold M and the resin R on the substrate are brought into contact with each other in the state in which the pattern surface PP of the mold M is deformed into the convex shape, light which illuminates the mold M and the substrate W is reflected by the pattern surface PP of the mold M and the surface of the substrate W. As described above, the interference fringes are generated by the interference between light reflected by the pattern surface PP of the mold M and light reflected by the surface of the substrate W. As shown in FIG. 6, letting d be an interval between the respective positions of the mold M and the substrate W from their centers to their peripheries, λ be a wavelength of light from the light source 41 (detection unit 11), and n be a refractive index of a medium between the mold M and the substrate W, a condition on which the interference fringes are generated is given by:

$$2nd = (m+\tfrac{1}{2})\lambda: \text{ bright line } (m=0,1,2 \ldots)$$

$$2nd = m\lambda: \text{ dark line}$$

In the contact region between the pattern surface PP of the mold M and the resin R on the substrate, the resin R is sandwiched between the pattern surface PP and the substrate W. As described above, since there is little difference in the refractive indices between the resin R and the pattern surface PP of the mold M, light is no longer reflected by the pattern surface PP. Therefore, the interference fringes are no longer generated in the contact region between the pattern surface PP of the mold M and the resin R on the substrate. Then, interference fringes similar to Newton rings which repeat several light and dark patterns concentrically are generated in the contact region between the pattern surface PP of the mold M and the resin R on the substrate.

Figure 7A:
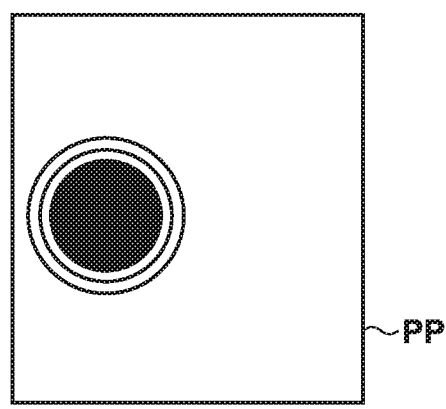
FIGS. 7A and 7B are views for explaining a case in which the pattern surface of the mold and a resin on the substrate contact each other in a state in which the mold and the substrate tilt relatively.
Figure 7B:
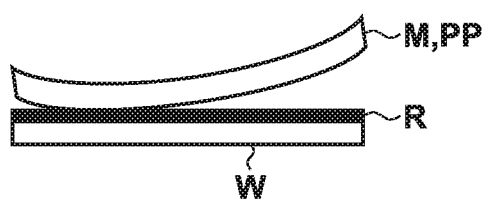

A case in which the pattern surface PP of the mold M and the resin R on the substrate contact each other in a state in which the mold M and the substrate W tilt relatively will be described with reference to FIGS. 7A and 7B. As shown in FIG. 7B, if the pattern surface PP of the mold M and the resin R on the substrate contact each other in the state in which the mold M tilts with respect to the substrate W, the detection unit 11 detects an interference pattern as shown in FIG. 7A. Referring to FIG. 7A, it can be found that the interference pattern (the center thereof) is generated while being displaced from the center of the pattern surface PP of the mold M. The detection unit 11 can also detect a scribe line surrounding the shot region on the substrate W and the edge of a region (pattern surface PP) where the pattern P of the mold M exists simultaneously with the interference pattern (the contact region between the pattern surface PP of the mold M and the resin R on the substrate and its surrounding interference fringes).

In this embodiment, the control unit 12 obtains the relative tilts (tilt value) between the mold M and the substrate W from the interference pattern detected by the detection unit 11 in the state in which the pattern surface PP of the mold M and the resin R of the substrate are in contact with each other. More specifically, the control unit 12 can obtain the value of the relative tilts between the mold M and the substrate W based on the position of the interference pattern in the region (pattern surface PP) where the pattern P of the mold M exists. At this time, the control unit 12 obtains the value of the relative tilts between the mold M and the substrate W with reference to information (such as a table) indicating the relationship between the position of the interference pattern in the region where the pattern P of the mold M exists and the relative tilts between the mold M and the substrate W. Note that the position of the interference pattern in the region where the pattern P of the mold M exists is, for example, a distance between the center of the interference pattern and the center of the region where the pattern P of the mold M exists. The position of the interference pattern in the region where the pattern P of the mold M exists may also be a distance between the edge of the region where the pattern P of the mold M exists and the center of the interference pattern or the outermost peripheral interference fringe in the interference pattern.

Then, the control unit 12 controls the substrate stage 2 and the mold stage 4 each functioning as the tilt unit to make the mold M (pattern surface PP) and the substrate W parallel to each other so as to reduce (correct) the relative tilts between the mold M and the substrate W obtained from the interference pattern. At this time, the relative tilts between the mold M and the substrate W may be corrected by only the substrate stage 2 or the mold stage 4, or by both of the substrate stage 2 and the mold stage 4.

As described above, the control unit 12 controls the substrate stage 2 and the mold stage 4 based on the position of the interference pattern in the region where the pattern P of the mold M exists. For example, the control unit 12 controls the substrate stage 2 and the mold stage 4 to reduce the distance between the center of the interference pattern and the center of the region where the pattern P of the mold M exists. Numerically, the control unit 12 controls the substrate stage 2 and the mold stage 4 such that the relative tilts between the mold M and the substrate W becomes equal to or less than 5 microradians.

Furthermore, the control unit 12 causes a storage unit such as the memory 12b to store information indicating the amounts of the relative tilts between the mold M and the substrate W obtained by the substrate stage 2 and the mold stage 4 in the state in which the pattern surface PP of the mold M and the resin R on the substrate are in contact with each other. When such information is stored in the memory 12b, the control unit 12 controls the substrate stage 2 and the mold stage 4 based on information stored in the memory 12b. This makes it possible to correct the relative tilts between the mold M and the substrate W, and make the mold M (pattern surface PP) and the substrate W parallel to each other even if the detection unit 11 does not detect the interference pattern.

Information indicating the amounts of the relative tilts between the mold M and the substrate W obtained by the substrate stage 2 and the mold stage 4 may be acquired when performing the imprint process on the first substrate of a lot or may be acquired when performing the imprint process on a test substrate or the like. Note that the detection unit 11 needs to detect the interference pattern when acquiring information indicating the amounts of the relative tilts between the mold M and the substrate W obtained by the substrate stage 2 and the mold stage 4.

The relative tilts between the mold M and the substrate W are caused by, for example, a force (pressing force) generated when bringing the pattern surface PP of the mold M and the resin R on the substrate into contact with each other. In this case, the relative tilts between the mold M and the substrate W change for each shot region on the substrate W. Therefore, information indicating the amounts of the relative tilts between the mold M and the substrate W obtained by the substrate stage 2 and the mold stage 4 is preferably stored in the memory 12b for each shot region on the substrate W.

The imprint process in the imprint apparatus 100 will be described. The imprint process includes a supplying step, the pressing step, a curing step, and a separating step. In the supplying step, the resin R is supplied to the substrate W by discharging the resin R onto the substrate from the dispenser 8. In the pressing step, the pattern surface PP of the mold M and the resin R on the substrate are brought into contact with each other in a state in which the mold M is deformed into the convex shape on the substrate side. Then, after bringing the part of the pattern surface PP of the mold M into contact with the resin R, the pattern surface PP is returned to the flat surface gradually and the resin R is brought into contact with the entire surface of the pattern surface PP. At this time, the substrate stage 2 and the mold stage 4 are controlled such that the detection unit 11 detects the interference pattern, and the relative tilts between the mold M and the substrate W are reduced based on that interference pattern. Then, information indicating the amounts of the relative tilts between the mold M and the substrate W obtained by the substrate stage 2 and the mold stage 4 is stored in the memory 12b. Note that when such information is stored in the memory 12b, the interference pattern need not be detected, and the substrate stage 2 and the mold stage 4 may be controlled based on information stored in the memory 12b. In the curing step, the resin R is irradiated with the ultraviolet rays from the light source 10 in the state in which the mold M and the resin R on the substrate are in contact with each other, thereby curing the resin R. In the separating step, the mold M is released from the cured resin R on the substrate.

As described above, the imprint apparatus 100 controls the relative tilts between the mold M and the substrate W based on the interference pattern generated when bringing the mold M (pattern surface PP) and the resin R on the substrate into contact with each other. This makes it possible, in the imprint apparatus 100, to reduce the relative tilts between the mold M and the substrate W in the state in which the mold M and the resin R are in contact with each other, and make the mold M and the substrate W parallel to each other. Therefore, the imprint apparatus 100 can transfer the pattern P of the mold M onto the substrate accurately while keeping the thickness (residual film thickness) of the resin R when curing the resin R on the substrate constant.

Second Embodiment

Figure 8:
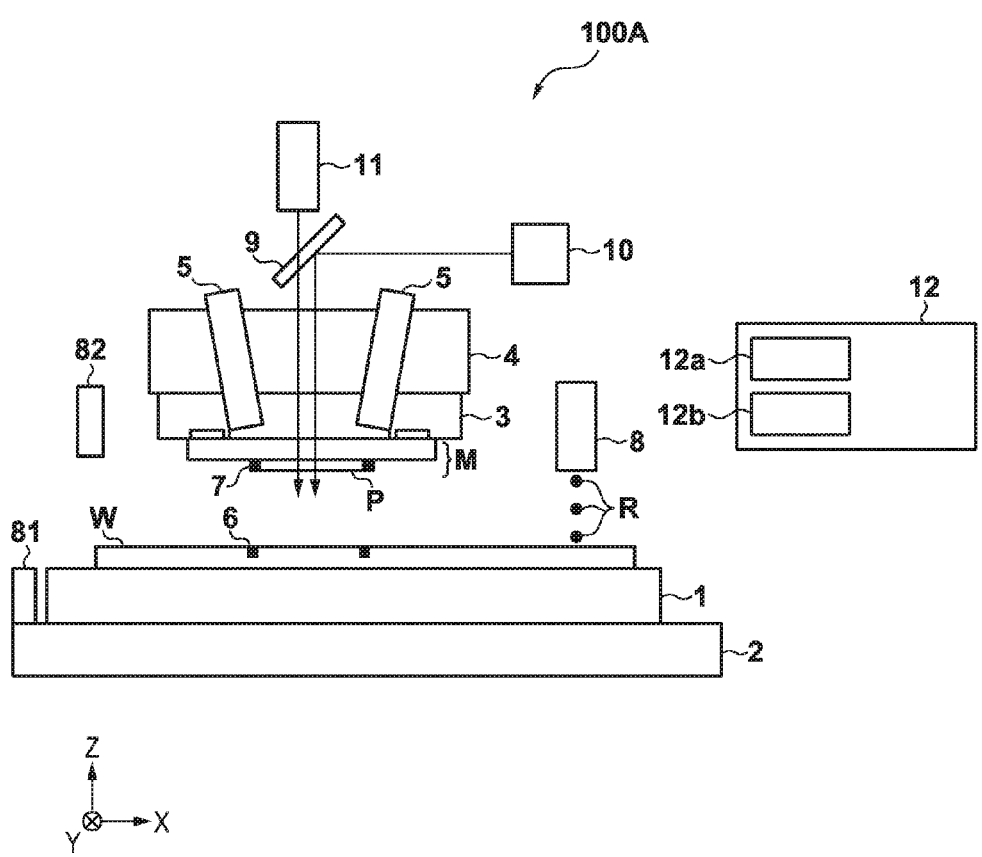
FIG. 8 is a schematic view showing the arrangement of an imprint apparatus according to the second embodiment of the present invention.

FIG. 8 is a schematic view showing the arrangement of an imprint apparatus 100A according to the second embodiment of the present invention. The imprint apparatus 100A includes, in addition to the arrangement of an imprint apparatus 100, a first measurement unit 81 and a second measurement unit 82. The first measurement unit 81 measures the tilt (three-dimensional flatness) of a mold M held by a mold chuck 3 and a mold stage 4 (first holding unit). The second measurement unit 82 measures the tilt (three-dimensional flatness) of a substrate W held by a substrate chuck 1 and a substrate stage 2 (second holding unit).

Before performing an imprint process, the imprint apparatus 100A scans the substrate W held by the substrate chuck 1 by moving the substrate stage 2 in the X and Y directions under the second measurement unit 82, and measures the tilt of the substrate W by the second measurement unit 82. The tilt of the substrate W measured by the second measurement unit 82 is stored in a memory 12$b$.

Next, the substrate stage 2 is moved in the X and Y directions, thereby making the first measurement unit 81 and the mold M held by the mold chuck 3 face to face. Then, the imprint apparatus 100A scans the mold M held by the mold chuck 3 by moving the substrate stage 2 in the X and Y directions, and measures the tilt of the mold M by the first measurement unit 81. The tilt of the mold M measured by the first measurement unit 81 is stored in the memory 12$b$. The tilt of the mold M measured by the first measurement unit 81 is stored in the memory 12$b$ until the mold M is recovered from the mold chuck 3. The tilt of the mold M suffices to be measured only once when exchanging the mold M.

A control unit 12 controls, based on the tilt of the mold M and the tilt of the substrate W stored in the memory 12$b$, the substrate stage 2 and the mold stage 4 each functioning as a tilt unit to make the mold M (a pattern surface PP) and the substrate W parallel to each other. More specifically, the control unit 12 controls, based on measurement results of the first measurement unit 81 and the second measurement unit 82, the substrate stage 2 and the mold stage 4 to reduce the relative tilts between the mold M and the substrate W in a state before bringing the mold M and the resin R on the substrate into contact with each other. This makes it possible to correct, before performing the imprint process, the relative tilts between the mold M and the substrate W owing to the tilt unique to the mold M and the tilt owing to the substrate W. It is therefore possible to reduce the amounts of the relative tilts between the mold M and the substrate W obtained by the substrate stage 2 and the mold stage 4 in a state in which the mold M and the resin R on the substrate are in contact with each other. It is also possible to reduce a time required to make the mold M and the substrate W parallel to each other in the state in which the mold M and the resin R on the substrate are in contact with each other. Note that the tilt unique to the mold M includes not only the tilt of the mold M itself but also the tilt of the mold M caused when the mold M is held by the mold chuck 3 and the mold stage 4. Similarly, the tilt unique to the substrate W includes not only the tilt of the substrate W itself but also the tilt of the substrate W caused when the substrate W is held by the substrate chuck 1 and the substrate stage 2.

The imprint process in the imprint apparatus 100A is the same as that in the imprint apparatus 100, and thus a detailed description thereof will be omitted.

Third Embodiment

A method of manufacturing a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) using an imprint apparatus 100 or 100A. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-000513 filed on Jan. 5, 2015, which is hereby incorporated by reference herein in its entirety.

What is claimed is:

1. An imprint method of forming a pattern in an imprint material on a substrate by using a mold, the method comprising:
    detecting an interference pattern between light reflected by the mold and light reflected by the substrate in a state in which the mold and the imprint material on the substrate are in contact with each other; and
    tilting, based on the interference pattern, the mold and the substrate relatively so as to reduce relative tilt between the mold and the substrate in the state,
    wherein the tilting includes specifying a relative position of the interference pattern in a region where a pattern of the mold exists by detecting an edge of the region and the interference pattern and tilting the mold and the substrate relatively based on the relative position.

2. A method of manufacturing an article, the method comprising:
    forming a pattern on a substrate using an imprint apparatus; and
    processing the substrate on which the pattern has been formed in the forming,
    wherein the imprint apparatus forms a pattern in an imprint material on the substrate by using a mold, and includes:
    a tilt unit configured to tilt the mold and the substrate relatively;
    a detection unit configured to detect an interference pattern between light reflected by the mold and light reflected by the substrate; and
    a control unit configured to control, based on the interference pattern detected by the detection unit in a state in which the mold and the imprint material on the substrate are in contact with each other, the tilt unit to reduce relative tilt between the mold and the substrate in the state, wherein the control unit specifies a relative position of the interference pattern in a region where a pattern of the mold exists by detecting an edge of the region and the interference pattern and control the detection unit based on the relative position.

3. An imprint method of forming a pattern in an imprint material on a substrate by using a mold, the method comprising:
   detecting an interference pattern between light reflected by the mold and light reflected by the substrate in a state in which the mold and the imprint material on the substrate are in contact with each other; and
   tilting, based on the interference pattern, the mold and the substrate relatively so as to reduce relative tilt between the mold and the substrate in the state,
wherein a control unit controls a tilt unit to reduce a distance between a center of the interference pattern and a center of a region where a pattern of the mold exists.

4. The imprint method according to claim 1, wherein a control unit controls a tilt unit such that relative tilt between the mold and the substrate is not more than 5 microradians.

5. The imprint method according to claim 1, wherein a control unit obtains a value of the relative tilt between the mold and the substrate based on a position of the interference pattern in a region where a pattern of the mold exists.

6. The imprint method according to claim 5, wherein the control unit obtains the value of the relative tilt between mold and substrate with reference to information indicating a relationship between the position of the interference pattern in the region where the pattern of the mold exists and relative tilt between the mold and the substrate.

7. The imprint method according to claim 1, further comprising a storage unit configured to store information indicating an amount of relative tilt between the mold and the substrate obtained by the tilt unit in a state in which the mold and the imprint material on the substrate are in contact with each other, wherein the information is stored in the storage unit and the control unit controls the tilt unit based on the information.

8. The imprint method according to claim 7, wherein the storage unit stores information indicating tilt amounts for each shot region on the substrate.

9. The imprint method according to claim 1, further comprising:
   holding the mold in a first holding unit configured to hold the mold;
   holding the substrate in a second holding unit configured to hold the substrate;
   measuring a tilt of the mold with a first measurement unit configured to measure a tilt of the mold held in the first holding unit; and
   measuring a tilt of the substrate with a second measurement unit configured to measure a tilt of the substrate held in the second holding unit,
   wherein the control unit controls, based on measurement results of the first measurement unit and the second measurement unit, the tilt unit to reduce the relative tilt between the mold and the substrate in a state before bringing the mold and the imprint material on the substrate into contact with each other.

* * * * *